United States Patent
Wilson et al.

(10) Patent No.: US 12,224,217 B2
(45) Date of Patent: Feb. 11, 2025

(54) RADIO FREQUENCY PACKAGE IMPLEMENTING A WINDOW FRAME WITH EDGE PLATING AND PROCESSES OF IMPLEMENTING THE SAME

(71) Applicant: Cree, Inc., Durham, NC (US)

(72) Inventors: Richard Wilson, Morgan Hill, CA (US); Haedong Jang, San Jose, CA (US); Simon Ward, Morgan Hill, CA (US); Madhu Chidurala, Los Altos, CA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 192 days.

(21) Appl. No.: 16/811,161

(22) Filed: Mar. 6, 2020

(65) Prior Publication Data

US 2021/0280478 A1  Sep. 9, 2021

(51) Int. Cl.
*H01L 23/043* (2006.01)
*H01L 21/48* (2006.01)
*H01L 23/495* (2006.01)

(52) U.S. Cl.
CPC ........ *H01L 23/043* (2013.01); *H01L 21/4817* (2013.01); *H01L 21/4846* (2013.01); *H01L 23/49562* (2013.01); *H01L 23/49575* (2013.01)

(58) Field of Classification Search
CPC ............ H01L 23/043; H01L 23/49562; H01L 23/49575; H01L 21/4817; H01L 21/4846
See application file for complete search history.

(56) References Cited

U.S. PATENT DOCUMENTS

| | | | |
|---|---|---|---|
| 8,907,467 B2 | 12/2014 | Komposch et al. | |
| 9,979,361 B1 * | 5/2018 | Mangaonkar | H03F 3/213 |
| 10,141,303 B1 | 11/2018 | Canning et al. | |
| 2014/0070365 A1 | 3/2014 | Viswanathan et al. | |
| 2015/0048492 A1 * | 2/2015 | Komposch | H01L 24/83 |
| | | | 257/680 |
| 2017/0117856 A1 * | 4/2017 | Zhu | H01L 23/66 |
| 2018/0350758 A1 * | 12/2018 | Liu | H01L 23/66 |

FOREIGN PATENT DOCUMENTS

| | | | |
|---|---|---|---|
| CN | 111279469 A | | 6/2020 |
| JP | 2007027592 A | * | 2/2007 |
| JP | 2014-057304 A | | 3/2014 |
| JP | 2017200124 A | * | 11/2017 |
| JP | 2018-107387 A | | 7/2018 |
| JP | 2020-535701 A | | 12/2020 |

* cited by examiner

*Primary Examiner* — Shaun M Campbell
(74) *Attorney, Agent, or Firm* — BakerHostetler

(57) ABSTRACT

A radio frequency (RF) package includes a support having a semiconductor die attach region; a frame that includes an electrically insulative member having a lower side attached to the support and an upper side opposite the support; the frame includes an opening at least partially registered with said semiconductor die attach region; and the frame includes an upper metallization at the upper side of the electrically insulative member and a lower metallization The frame includes first electrically conductive edge connection connecting the first metallization to the first lower metallization.

22 Claims, 9 Drawing Sheets

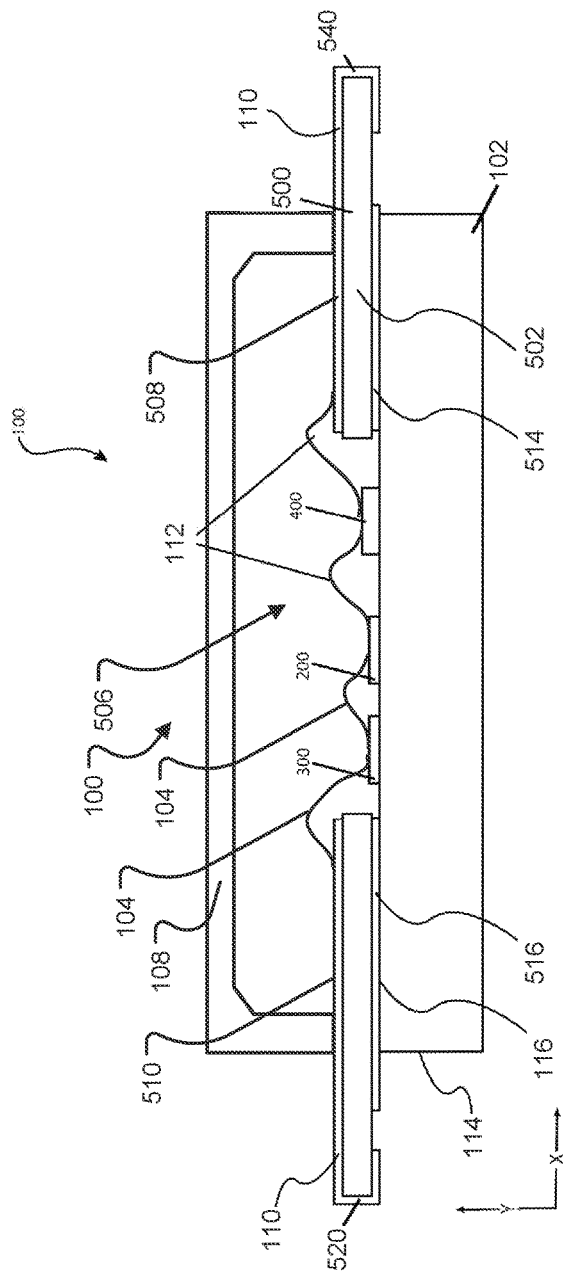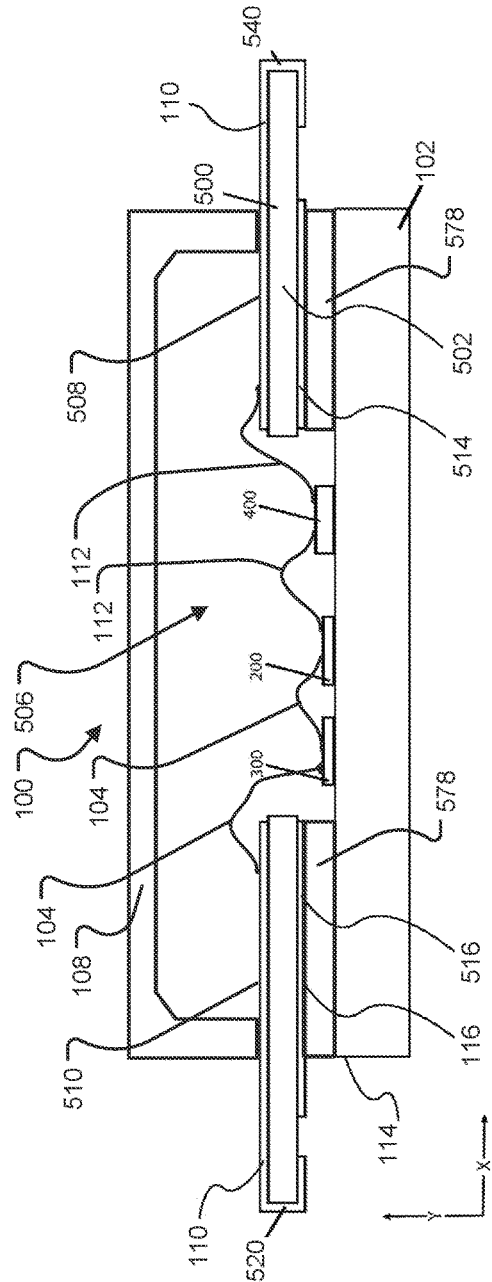
FIG. 2A
FIG. 2B
FIG. 2

RADIO FREQUENCY PACKAGE IMPLEMENTING A WINDOW FRAME WITH EDGE PLATING AND PROCESSES OF IMPLEMENTING THE SAME

FIELD OF THE DISCLOSURE

The disclosure relates to a radio frequency package implementing a window frame. The disclosure further relates to a radio frequency package implementing a window frame with edge plating.

The disclosure further relates to a process of implementing a radio frequency package having a window frame. The disclosure further relates to a process of implementing a radio frequency package having a window frame with edge plating.

The disclosure further relates to a process of manufacturing a radio frequency package having a window frame. The disclosure further relates to a process of manufacturing a radio frequency package having a window frame with edge plating.

BACKGROUND OF THE DISCLOSURE

Radio Frequency (RF) power packages such as power amplifiers are used in a variety of applications such as base stations for wireless communication systems and the like. The signals amplified by the RF power amplifiers often include signals that have a high frequency modulated carrier having frequencies in the 400 megahertz (MHz) to 60 gigahertz (GHz) range. The baseband signal that modulates the carrier is typically at a relatively lower frequency and, depending on the application, can be up to 300 MHz or higher.

One large portion of a cost of the RF power package is a cost of the package and the cost of packaging processes. In this regard, the RF power package typically includes a metal flange, a Printed Circuit Board (PCB) based window frame, a lid, and/or the like. With reference to FIG. 9A and FIG. 9B, these typical RF power packages 1 include a window frame 2 having via holes 3. The via holes 3 electrically connect a top metal 4 to a bottom metal 5 for an electrical grounding connection.

One problem with the via holes 3 on the window frame 2 is that it limits the positions to which a picking tool can be utilized. In this regard, the picking tool uses a vacuum to hold and move the window frame 2. However, using the picking tool in positions where the via holes 3 are located will cause the picking tool to lose vacuum and fail to pick and move and/or possibly drop the window frame 2. Additionally, the picking tool sucks material through the via holes 3. For example, the picking tool can suck adhesive that attaches the window frame 2 to the flange. Prior art processes of resolving this issue include plugging the via holes or using solder mask to cover the holes. However, plugging the via holes may be difficult when very thin board material is used due to limited processing capabilities. Moreover, covering the via holes by using a solder ask is limited as well when a component needs to be electrically connected to the top metal surface since the solder mask is non-conductive. These, processes are not only limited as described above but are also costly. Additionally, the construction of via holes can create parasitic grounding inductance and resistance. Moreover, the construction of via holes can create substantial parasitic grounding inductance and resistance with higher frequency applications, higher power applications, high-frequency applications, and/or high-power applications as defined herein.

Accordingly, what is needed is a RF package and process of implementing an RF package that results in reduced cost. Additionally, what is needed is a RF package and process of implementing an RF package that reduces undesired inductance and resistance.

SUMMARY OF THE DISCLOSURE

As described above, radio frequency packages implementing via holes, such as on the window frame, present a number of manufacturing issues and/or performance issues. Attempts to address these manufacturing issues result in increased costs and yet still do not fully address the manufacturing issues or performance issues. The disclosure addresses the manufacturing issues by implementing radio frequency packages configured such that a connection may be formed between a top metal portion and a bottom metal portion through edge plating using available cavities or side walls of an outline of the window frame. The edge plating may be easily implemented as edge plating is one of the typical processes implemented during printed circuit board (PCB) fabrication. Typical top metal portions and bottom metal portions are structured with a pull back or set off from the board edges of the window frame. However, the disclosed method and design of the top metal portion and bottom metal portion and the dielectric material may be configured to be flush with the board edges. Then, during a plating process, the top metal portion and bottom metal portion are electrically connected through the edge plating. The final routing creates the cavities or side walls which are not plated or disconnected. Additionally, the disclosed configuration and method implementing edge plating may lower a parasitic grounding inductance and resistance. In particular, the disclosed configuration and method implementing edge plating may lower a parasitic grounding inductance and resistance with higher frequency applications, higher power applications, high-frequency applications and/or high-power applications as defined herein. Moreover, the disclosed configuration and method implementing wide edge plating may lower a parasitic grounding inductance and resistance. In particular, the disclosed configuration and method implementing wide edge plating may lower a parasitic grounding inductance and resistance with higher frequency applications; higher power applications, high-frequency applications and/or high-power applications as defined herein.

One aspect includes a radio frequency (RF) package that includes a support having a semiconductor die attach region; a frame that includes an electrically insulative member having a lower side attached to the support and an upper side opposite the support; the frame includes an opening at least partially registered with said semiconductor die attach region; the frame includes an upper metallization at the upper side of the electrically insulative member and a lower metallization at the lower side of the electrically insulative member; and the frame includes an electrically conductive edge connection connecting the upper metallization to the lower metallization.

One aspect includes a process of implementing a radio frequency (RF) package that includes configuring a support having a semiconductor die attach region; configuring a frame that includes an electrically insulative member having a lower side attached to the support and an upper side opposite the support; configuring the frame to have an opening at least partially registered with said semiconductor die attach region; configuring the frame with an upper metallization at the upper side of the electrically insulative member and a lower metallization at the lower side of the electrically insulative member; and configuring the frame with an electrically conductive edge connection the upper metallization to the lower metallization.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings:

FIG. 2 includes FIG. 2A that illustrates a cross-sectional view of the package according to one aspect of FIG. 1; and FIG. 2 further includes FIG. 2B that illustrates a cross-sectional view of the package according to another aspect of FIG. 1.

FIG. 4 includes FIG. 4B illustrating a partial cross-sectional view of the package according to FIG. 1.

FIG. 9 includes FIG. 9B illustrating a cross-sectional view of a prior art window frame.

DETAILED DESCRIPTION OF THE DISCLOSURE

Figure 1:
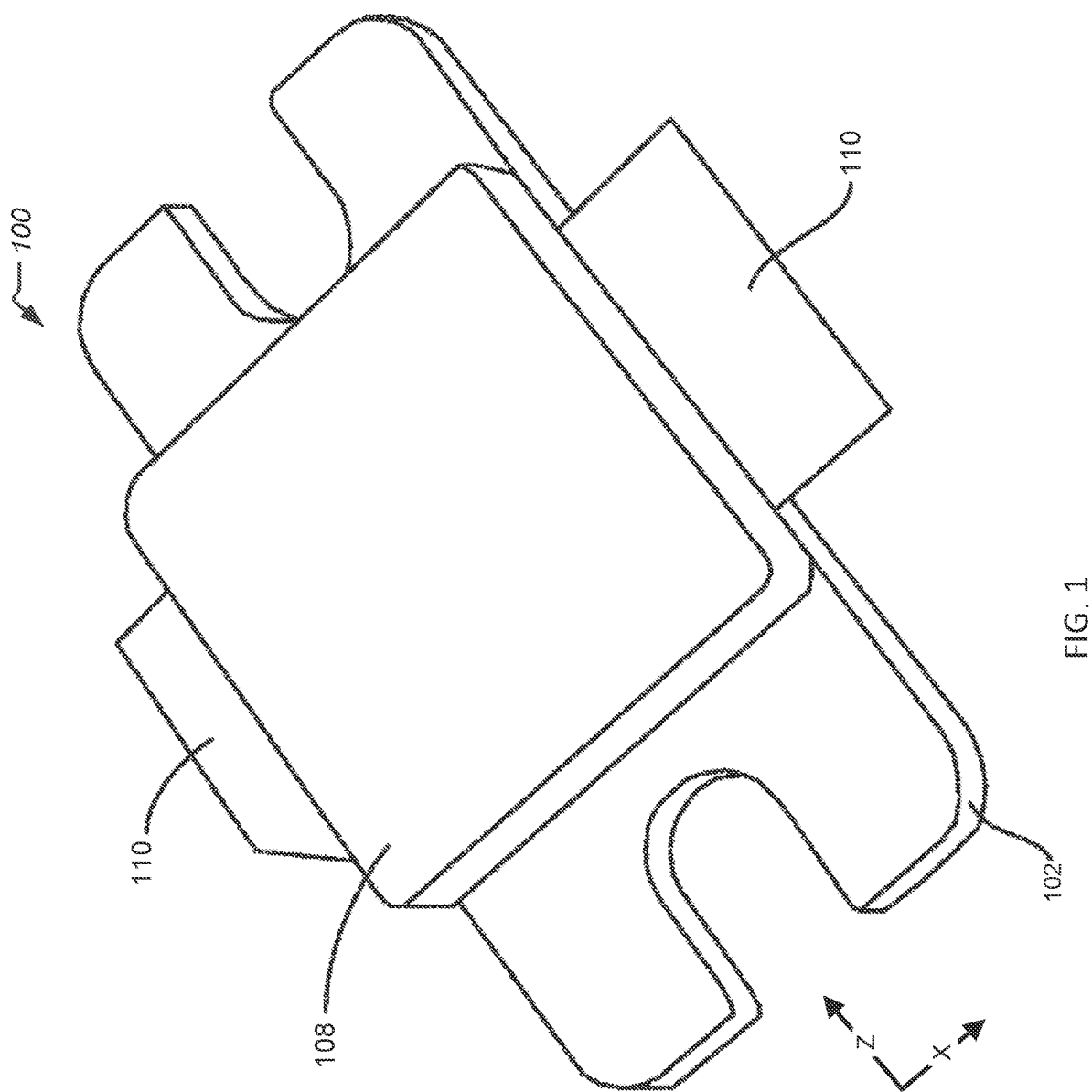
FIG. 1 illustrates a perspective view of a package according to the disclosure.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects, as the skilled artisan would recognize, even if not explicitly stated herein. Descriptions of well-known components and processing techniques may be omitted so as not to unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings and in the different embodiments disclosed.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto another element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to another element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 illustrates a perspective view of a package according to the disclosure.

FIG. 2 includes FIG. 2A that illustrates a cross-sectional view of the package according to one aspect of FIG. 1; and FIG. 2 further includes FIG. 2B that illustrates a cross-sectional view of the package according to another aspect of FIG. 1.

Figure 3:
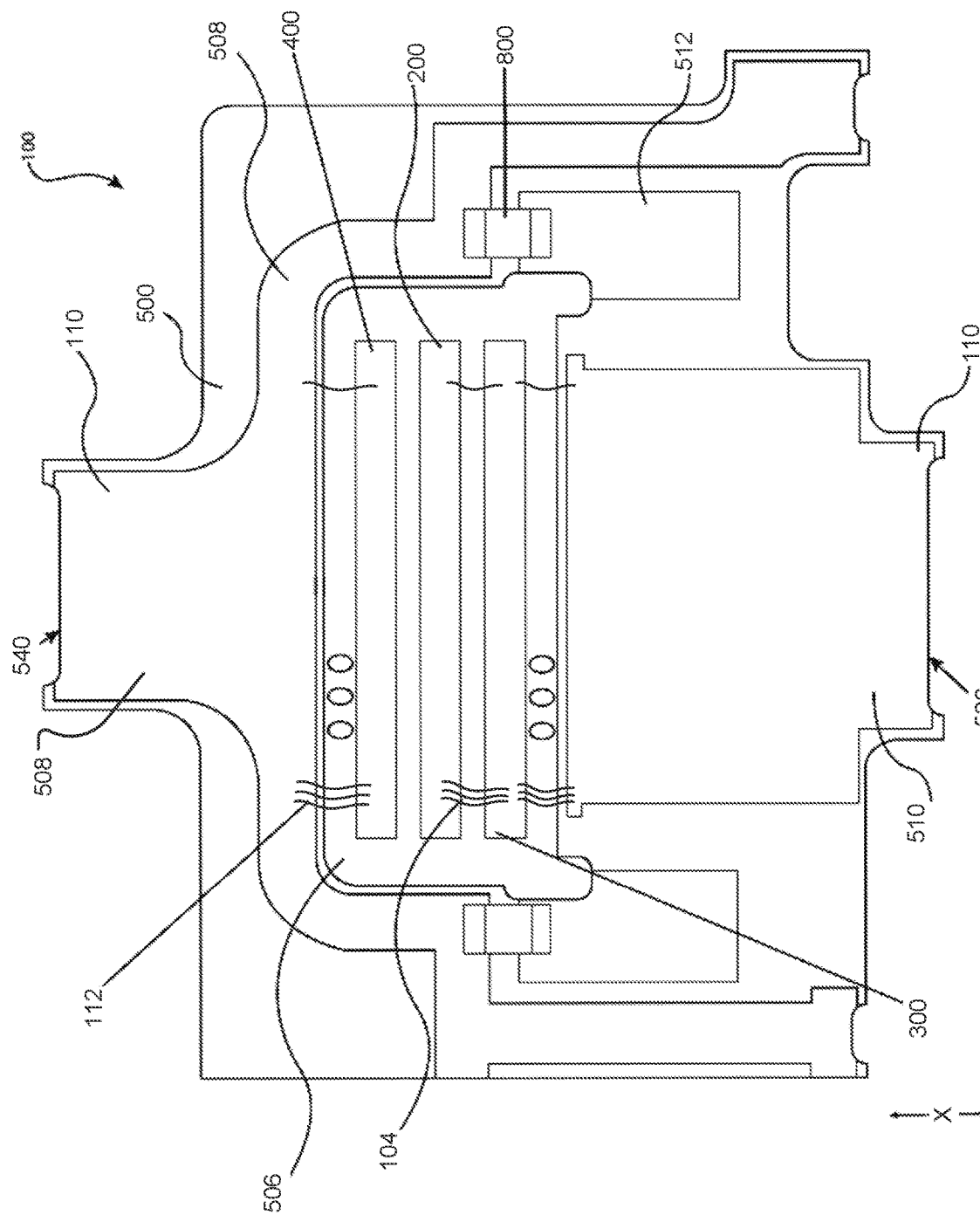
FIG. 3 illustrates an internal top view of the package according to FIG. 1.

FIG. 3 illustrates an internal top view of the package according to FIG. 1.

In particular, FIG. 1, FIG. 2A, FIG. 2B and FIG. 3 illustrate exemplary implementations of a package 100 that may include any one or more of the features, components, arrangements, and the like as described herein. In particular, the package 100 may be implemented as a RF package, a RF amplifier package, a RF power amplifier package, a RF power transistor package, a RF power amplifier transistor package, and/or the like as described herein.

With reference to FIG. 2A and FIG. 2B, the package 100 may include one or more semiconductor devices 400, at least one device 200, at least one secondary device 300, a window frame 500, and a support 102.

The at least one device 200 and/or the at least one secondary device 300 may be implemented as RF devices. The at least one device 200 and/or the at least one secondary device 300 may implement one or more of resistors, inductors, capacitors, Metal-Oxide-Silicon (MOS) capacitors, impedance matching circuits, matching circuits, input matching circuits, output matching circuits, harmonic filters, harmonic terminations, couplers, baluns, power combiners, power dividers, radio frequency (RF) circuits, radial stub circuits, transmission line circuits, fundamental frequency matching circuits, baseband termination circuits, second order harmonic termination circuits, integrated passive devices (IPD), matching networks, and the like to support various functional technology as input, output, and/or intrastage functions to the one or more semiconductor devices 400, the package 100, and/or the like. In one aspect, the at least one device 200 and/or the at least one secondary device 300 may implement one or more inductors and may be utilized in the package 100 implementing the one or more semiconductor devices 400 as a single die, a monolithic microwave integrated circuit (MMIC), a multi-stage and multi-path (e.g., Doherty) transistor package, and/or the like.

The one or more semiconductor devices 400 may include one or more of a wide band-gap semiconductor device, an ultra-wideband device, a GaN based device, a Metal Semiconductor Field-Effect Transistor (MESFET), a Metal Oxide Field Effect Transistor (MOSFET), a Junction Field Effect Transistor (JFET), a laterally-diffused metal-oxide semiconductor (LDMOS) transistor, a Bipolar Junction Transistor (BJT), an Insulated Gate Bipolar Transistor (IGBT), a high-electron-mobility transistor (HEMT), a Wide Band Gap (WBG) semiconductor, a component such as a General-Purpose Broadband component, a Telecom component, a L-Band component, a S-Band component, a X-Band component, a C-Band component, a Ku-Band component, a Satellite Communications component, a Doherty configuration and/or the like. In one aspect, the Doherty configuration may implement a Doherty amplifier that may include a plurality of amplifiers. The plurality of amplifiers may include a carrier power amplifier and a peaking amplifier on multiple stages and/or multiple paths.

The package 100 may be implemented to include an open cavity configuration suitable for use with the one or more semiconductor devices 400, the window frame 500, the at least one device 200, and the at least one secondary device 300, and/or other components of the package 100 of the disclosure. In particular, the open cavity configuration may utilize an open cavity package design. In some aspects, the open cavity configuration may include a lid 108 or other enclosure for protecting interconnects, circuit components, the at least one device 200, the at least one secondary device 300, the one or more semiconductor devices 400, the window frame 500, and/or the like. The package 100 may include a ceramic body and/or the lid 108 may be made from a ceramic material. In one aspect, the ceramic material may include aluminum oxide ($Al_2O_3$). In one aspect, the lid 108 may be attached to the window frame 500 with an adhesive. In one aspect, the adhesive may be epoxy based. The package 100 may include one or more metal contacts 110 that may be configured as terminals.

Inside the package 100, the one or more semiconductor devices 400 may be attached to the support 102 via a die attach material. One or more bond wires 112 may couple the one or more semiconductor devices 400 to the window frame 500 and/or to at least one of the one or more metal contacts 110. Additionally, the one or more bond wires 112 may couple the one or more semiconductor devices 400, to the at least one device 200, and/or to the at least one secondary device 300.

Additionally, inside the package 100, the at least one device 200 and the at least one secondary device 300 may be arranged on the support 102. Additionally, inside the package 100, one or more interconnects 104, shown in an exemplary configuration, may connect between the one or more metal contacts 110, the window frame 500, the at least one device 200, the at least one secondary device 300, and/or the one or more semiconductor devices 400. The at least one device 200 and the at least one secondary device 300 may be attached to the support 102 via a die attach material.

The window frame 500 may be configured to isolate a source, a gate, and a drain of the one or more semiconductor devices 400. The window frame 500 may be configured to be more cost effective, provide better coefficient of thermal expansion (CTE) matching with the support 102, and enable high flexibility in lead configurations for both straight lead and surface mount configurations. The window frame 500 may also be configured to be rigid and therefore more stable and not susceptible to bending.

The support 102 may be made of an electrically conductive material such as copper (Cu), copper-molybendum, copper laminate structure, Copper-tungsten (CuW), and/or the like and may have a CTE, which closely matches that of the window frame 500. The source side of the one or more semiconductor devices 400 may be attached to an inner die attach region of the support 102 by an adhesive, soldering, sintering, eutectic bonding, thermal compression bonding, ultrasonic bonding/welding, and/or the like as described herein. In particular, the source side of the one or more semiconductor devices 400 may be electrically connected to the support 102.

The window frame 500 may include conductive pathways, tracks or signal traces etched from copper sheets laminated, embedded, and/or otherwise attached to an electrically insulative member 502. The window frame 500 may be attached to an outer peripheral region 116 of the support 102. The electrically insulative member 502 of the window frame 500 may have an opening 506 for receiving the one or more semiconductor devices 400, the at least one device 200, and the at least one secondary device 300, and/or the like that may be attached to an inner die attach region of the support 102. The electrically insulative member 502 may extend outward beyond a lateral sidewall 114 of the support 102 to provide support for upper and lower metallizations embedded in or laminated to opposing sides of the electrically insulative member 502.

The package 100 may further include a discrete device 800 mounted onto the second metallization 508 and the first metallization 512. The discrete device 800 may be one or more of a surface mount device (SMD) component, a surface mount device (SMD) capacitor, a ceramic capacitor, a surface mount device (SMD) ceramic capacitor, an inductor, a surface mount device (SMD) inductor, a resistor, a surface mount device (SMD) resistor, a power divider, a surface mount device (SMD) power divider, a power splitter, a surface mount device (SMD) power splitter, an amplifier, a balanced amplifier, a surface mount device (SMD) amplifier, a surface mount device (SMD) balanced amplifier, a combiner, a surface mount device (SMD) combiner, and/or the like. The discrete device 800 may be implemented as a radio frequency device, a radio frequency circuit device, a radio frequency component device, or the like.

In this regard, the discrete device 800 may include terminals arranged on a bottom surface. For example, the discrete device 800 implemented as a surface mount device (SMD) component, such as a surface mount device (SMD) ceramic capacitor, may include one or more terminals arranged on a bottom surface of the discrete device 800 that may connect to the second metallization 508 and the first metallization 512.

In more detail, a second metallization 508 may be embedded in or laminated to a top side of the electrically insulative member 502 facing away from the support 102 and may be electrically connected to the one or more semiconductor devices 400 at a top side of the one or more semiconductor devices 400 facing away from the support 102. In one embodiment, the second metallization 508 forms an output terminal of the package 100, which may be electrically connected to the one or more semiconductor devices 400.

With reference to FIG. 3, the top side of the electrically insulative member 502 may have a first metallization 512 spaced apart from the second metallization 508, which provides a connection to the one or more semiconductor devices 400. The first metallization 512 may be configured to connect to the second metallization 508 via a discrete device 800.

A third metallization 510 also disposed at the top side of the electrically insulative member 502 may be spaced apart from the second metallization 508 and the first metallization 512. The third metallization 510 forms an input terminal of the package 100 which is electrically connected to the at least one device 200, the one or more semiconductor devices 400, and/or the window frame 500.

The electrically insulative member 502 of the window frame 500 may have a bottom side which may be attached to the outer peripheral region 116 of the support 102. In one aspect, the window frame 500 may have a bottom side which may be attached to the outer peripheral region 116 utilizing a conductive adhesive. In one aspect, the window frame 500 may have a bottom side which may be attached to the outer peripheral region 116 utilizing an intervening ceramic structure 578 as illustrated in FIG. 2B. In one aspect, the intervening ceramic structure 578 may include a ceramic material such as aluminum oxide ($Al_2O_3$). In one aspect, the intervening ceramic structure 578 may be plated with one or more metals including copper, gold, and the like, and combinations thereof. Additional lower side metallizations may be provided at the bottom ide of the electrically insulative member 502. Each one of the lower metallizations may correspond to one of the metallizations disposed at the top side of the electrically insulative member 502. For example, a third lower metallization 516 may correspond to the third metallization 510 on the top side, a second lower metallization 514 may correspond to the second metallization 508 on the top side, and a lower first metallization 570 corresponds to the first metallization 512 on the top side as illustrated in FIG. 4.

Figure 4:
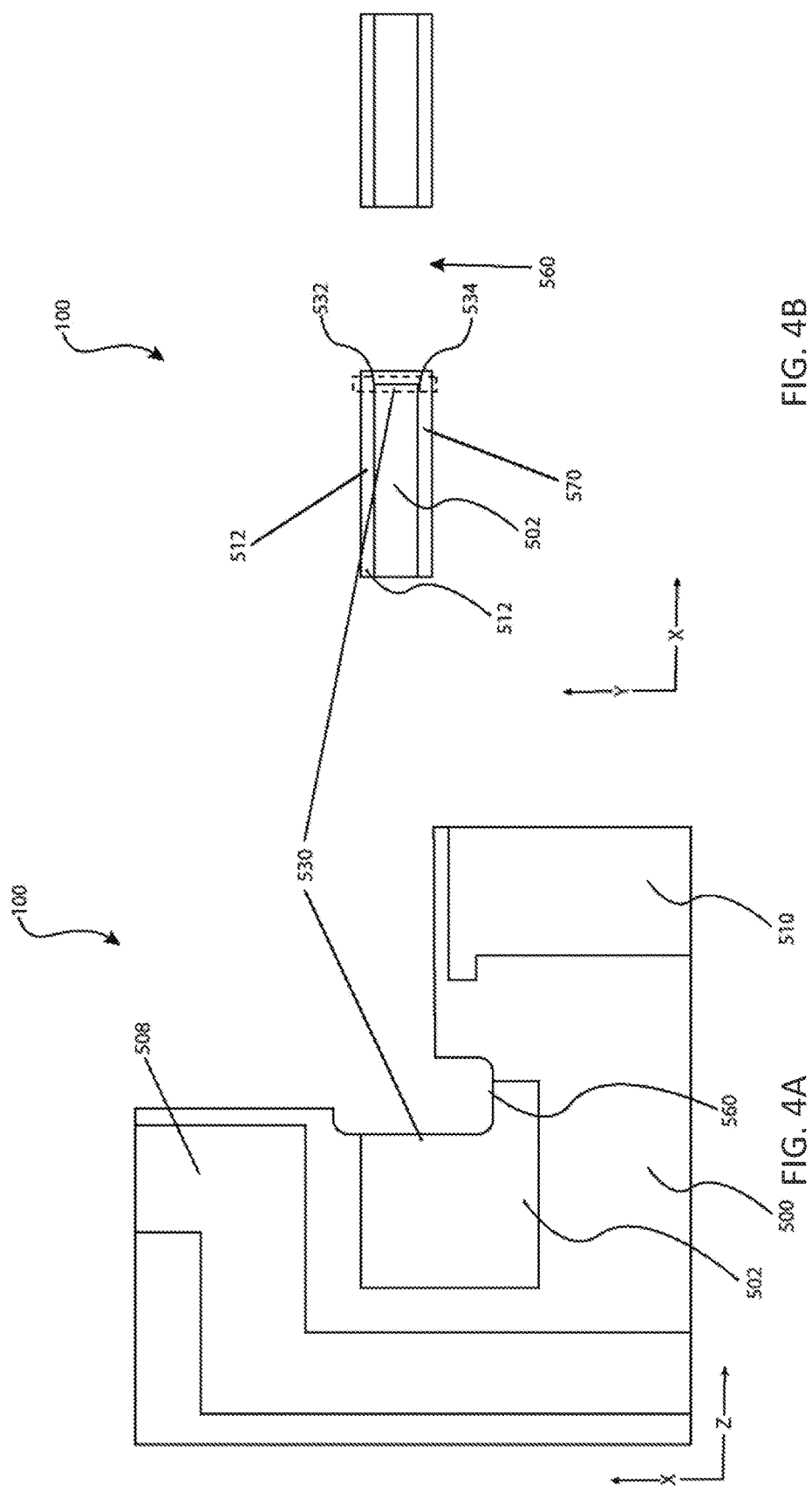
FIG. 4 includes FIG. 4A illustrating a partial top view of the package according to FIG. 1.

FIG. 4 includes FIG. 4A illustrating a partial top view of the package according to FIG. 1; and FIG. 4 includes FIG. 4B illustrating a partial cross-sectional view of the package according to FIG. 1.

As described above, corresponding ones of the upper and lower metallizations may be electrically connected to each other. As illustrated in FIG. 4, an electrical connection 530 may connect the first metallization 512 to a lower first metallization 570. In particular, the electrical connection 530 may be implemented as an edge plating on the electrically insulative member 502 of the window frame 500 at least along the y-axis. In one aspect; the electrical connection 530 may be implemented as an edge plating on the electrically insulative member 502 within a cavity hole 560 of the window frame 500. In one aspect, the electrical connection 530 may be implemented as a wide edge plating on the electrically insulative member 502 of the window frame 500. The first metallization 512 may extend all the way to an edge 532 of the electrically insulative member 502; and the lower first metallization 570 may extend all the way to an edge 534 of the electrically insulative member 502. In other words, the first metallization 512 and the lower first metallization 570 may be configured to be flush with the board edges of the electrically insulative member 502. Additionally, the electrical connection 530 may extend from the edge 532 of the first metallization 512 down to the edge 534 of the lower first metallization 570. Accordingly, the electrical connection 530 may electrically connect the first metallization 512 to the lower first metallization 570. Although FIG. 4 illustrates a particular location for the electrical connection 530, the electrical connection 530 may be located anywhere within the window frame 500 to connect the first metallization 512 to the lower first metallization 570. In particular, in some aspects the electrical connection 530 may be located on the outer edges of the window frame 500; and/or in some aspects the electrical connection 530 may be located on the inner edges of the window frame 500 within the opening 506 of the window frame 500.

Accordingly, the electrical connection 530 is configured and implemented to avoid use of any vias to electrically connect the first metallization 512 to the lower first metallization 570. Accordingly, the electrical connection 530 reduces the cost of the package and packet processing by avoiding implementation of vias and/or reducing usage of vias. In particular, in some aspects the window frame 500 may still implement some vias based on design, application, or the like. Moreover, the electrical connection 530 may lower a parasitic grounding inductance and resistance. In particular, the electrical connection 530 implementing edge plating may lower a parasitic grounding inductance and resistance with high-frequency applications and/or high-power applications as defined herein. Moreover, the electrical connection 530 implementing wide edge plating may lower a parasitic grounding inductance and resistance. In particular, the electrical connection 530 implementing wide edge plating may lower a parasitic grounding inductance and resistance with higher frequency and higher power applications. In this regard, wide edge plating may be defined as plating that covers 60% to 100% of a particular area of the electrically insulative member 502, 60% to 70% of a particular area of the electrically insulative member 502, 70% to 80% of a particular area of the electrically insulative member 502, 80% to 90% of a particular area of the electrically insulative member 502, or 90% to 100% of a particular area of the electrically insulative member 502.

The edge plating may comprise a metallic material such as copper, gold, nickel, palladium, silver, and the like, and combinations thereof. In one or more aspects, the edge plating may include routing processes, plated constellation configurations, long-hole configurations, castellation plating, and/or the like.

Figure 5:
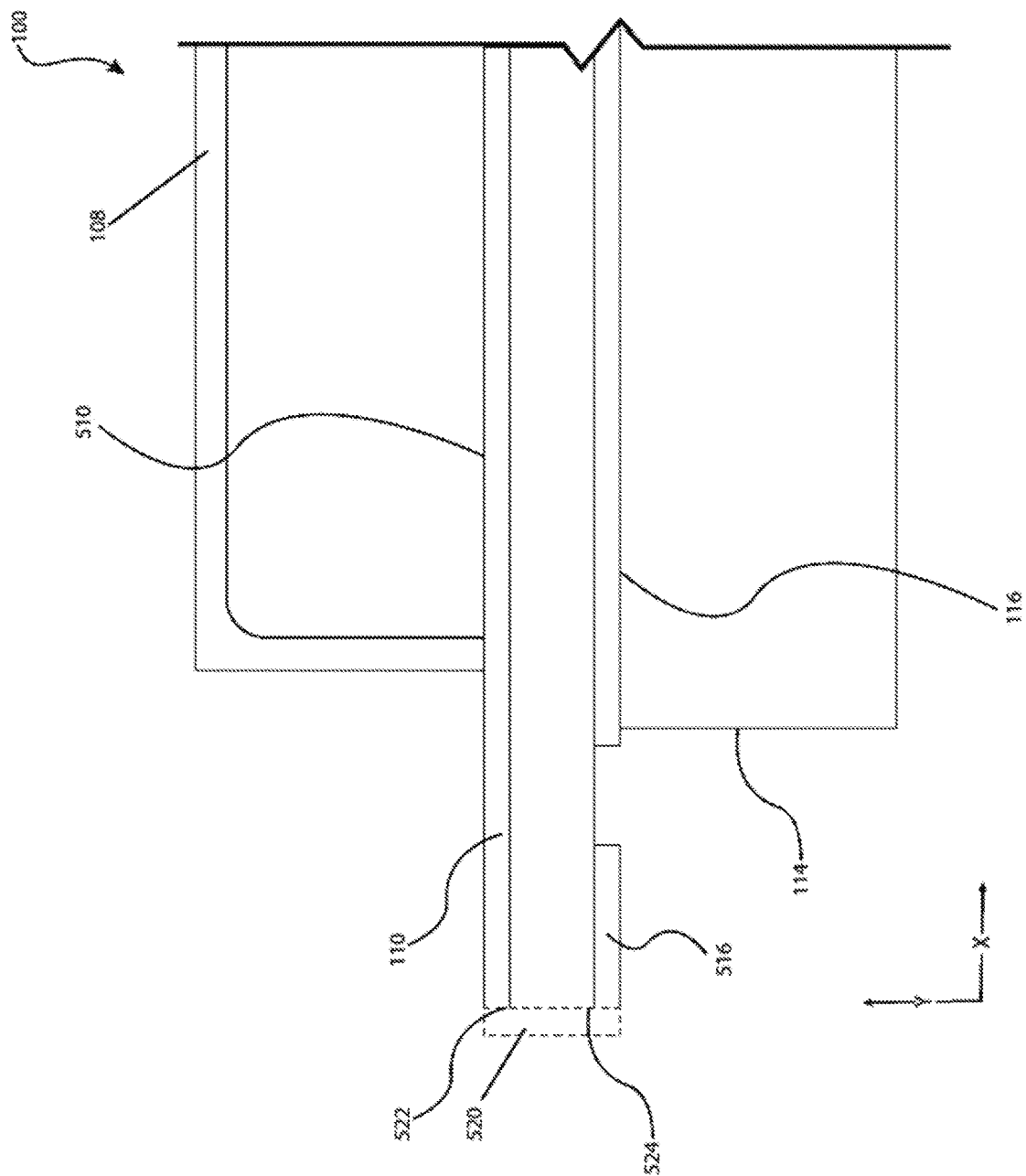
FIG. 5 illustrates a partial cross-sectional view of the package according to FIG. 1.

FIG. 5 illustrates a partial cross-sectional view of the package according to FIG. 1.

As described above, corresponding ones of the upper and lower metallizations may be electrically connected to each other. As illustrated in FIG. 5, an electrical connection 520 may connect the third lower metallization 516 to the third metallization 510. In particular, the electrical connection 520 may be implemented as an edge plating on the electrically insulative member 502 of the window frame 500. In one aspect, the electrical connection 520 may be implemented as a wide edge plating on the electrically insulative member 502 of the window frame 500. In this regard, the third metallization 510 may extend all the way to an edge 522 of the electrically insulative member 502; and the third lower metallization 516 may extend all the way to an edge 524 of the electrically insulative member 502. In other words, the third metallization 510 and the third lower metallization 516 may be configured to be flush with the board edges of the electrically insulative member 502. Additionally, the electrical connection 520 may extend from the edge 522 of the third metallization 510 down to the edge 524 of the third lower metallization 516. Accordingly, the electrical connection 520 may electrically connect the third metallization 510 to the third lower metallization 516. Although FIG. 5 illustrates a particular location for the electrical connection 520, the electrical connection 520 may be located anywhere within the window frame 500 to connect the third metallization 510 to the third lower metallization 516. In particular, in some aspects the electrical connection 520 may be located on the outer edges of the window frame 500; and/or in some aspects the electrical connection 520 may be located on the inner edges of the window frame 500 within the opening 506 of the window frame 500.

Accordingly, the electrical connection 520 is configured and implemented to avoid use of any vias to electrically connect the third metallization 510 to the third lower metallization 516. Accordingly, the electrical connection 520 reduces the cost of the package and packet processing by avoiding implementation of vias and/or reducing usage of vias. In particular, in some aspects the window frame 500 may still implement some vias based on design, application, or the like. Moreover, the electrical connection 520 may lower a parasitic grounding inductance and resistance. In particular, the electrical connection 520 implementing edge plating may lower a parasitic grounding inductance and resistance with high-frequency applications and/or high-power applications as defined herein. Moreover, the electrical connection 520 implementing wide edge plating may lower a parasitic grounding inductance and resistance. In particular, the electrical connection 520 implementing wide edge plating may lower a parasitic grounding inductance and resistance with high-frequency applications and/or high-power applications as defined herein.

Figure 6:
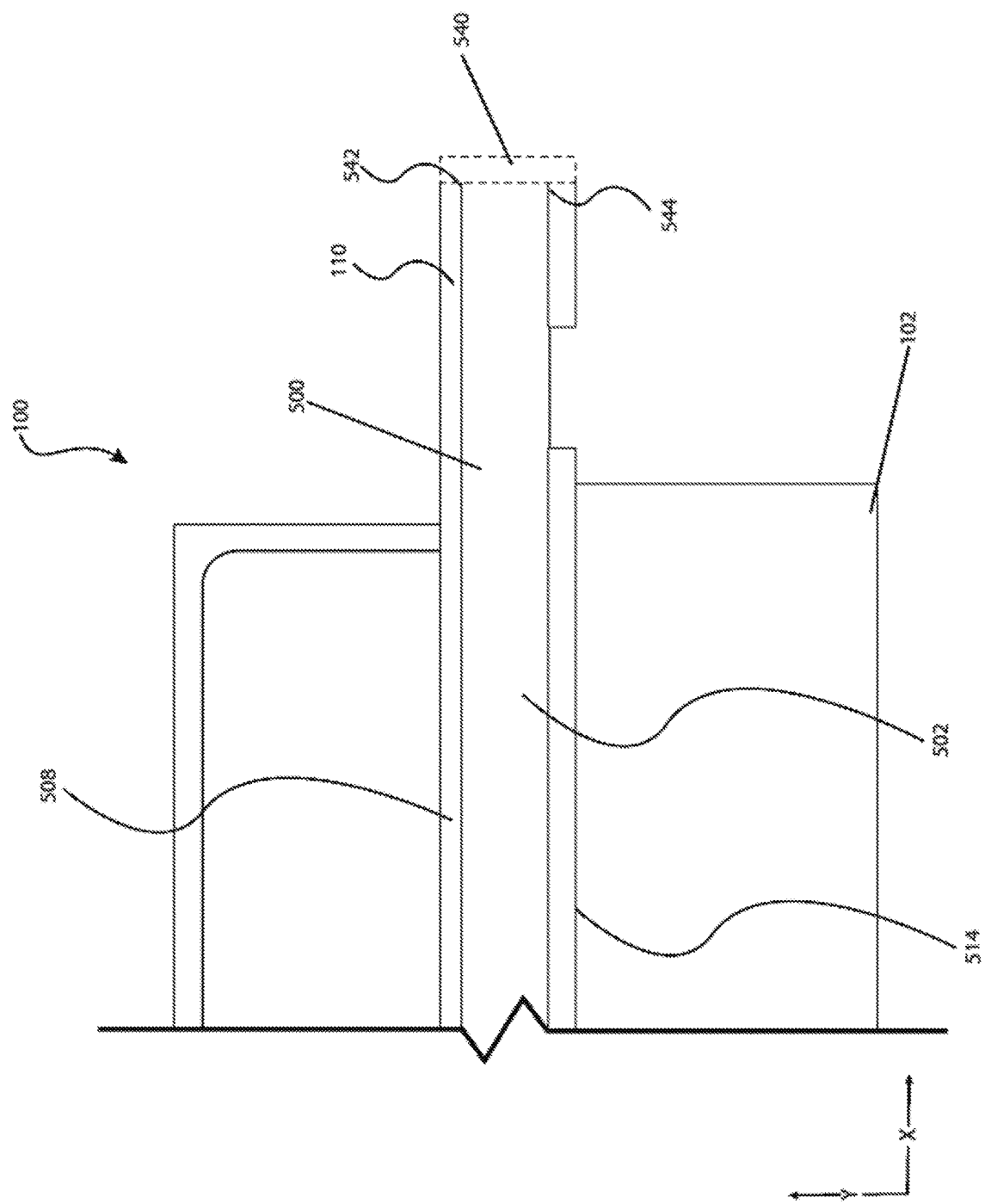
FIG. 6 illustrates a partial cross-sectional view of the package according to FIG. 1.

FIG. 6 illustrates a partial cross-sectional view of the package according to FIG. 1.

As described above, corresponding ones of the upper and lower metallizations may be electrically connected to each other. As illustrated in FIG. 6, an electrical connection 540 may connect the second lower metallization 514 to the second metallization 508. In particular, the electrical connection 540 may be implemented as an edge plating on the electrically insulative member 502 of the window frame 500. In one aspect, the electrical connection 540 may be implemented as a wide edge plating on the electrically insulative member 502 of the window frame 500. In this regard, the second metallization 508 may extend all the way to an edge 542 of the electrically insulative member 502; and the second lower metallization 514 may extend all the way to an edge 544 of the electrically insulative member 502. In other words, the second metallization 508 and the second lower metallization 514 may be configured to be flush with the board edges of the electrically insulative member 502. Additionally, the electrical connection 540 may extend from the edge 542 of the second metallization 508 down to the edge 544 of the second lower metallization 514. Accordingly, the electrical connection 540 may electrically connect the second metallization 508 to the second lower metallization 514. Although FIG. 6 illustrates a particular location for the electrical connection 540, the electrical connection 540 may be located anywhere within the window frame 500 to connect the second metallization 508 to the second lower metallization 514. In particular, in some aspects the electrical connection 540 may be located on the outer edges of the window frame 500; and/or in some aspects the electrical connection 540 may be located on the inner edges of the window frame 500 within the opening 506 of the window frame 500.

Accordingly, the electrical connection 540 is configured and implemented to avoid use of any vias to electrically connect the second metallization 508 to the second lower metallization 514. Accordingly, the electrical connection 540 reduces the cost of the package and packet processing by avoiding implementation of vias and/or reducing usage of vias. In particular, in some aspects the window frame 500 may still implement some vias based on design, application, or the like. Moreover, the electrical connection 540 may lower a parasitic grounding inductance and resistance. In particular, the electrical connection 540 implementing edge plating may lower a parasitic grounding inductance and resistance with high-frequency applications and/or high-power applications as defined herein. Moreover, the electrical connection 540 implementing wide edge plating may lower a parasitic grounding inductance and resistance. In particular, the electrical connection 540 implementing wide edge plating may lower a parasitic grounding inductance and resistance with high-frequency applications and/or high-power applications as defined herein.

Referring back to FIG. 2, window frame 500 may be attached to the outer peripheral region 116 of the support 102 e.g. using an adhesive, soldering, sintering, eutectic bonding, thermal compression bonding, ultrasonic bonding/welding, and/or the like as described herein. In the case of a soft solder or eutectic solder as the window frame attach material, an optional copper ring may also be provided on the part of the window frame 500 which attaches to the outer peripheral region 116 of the support 102. The optional copper ring can be used to provide an RF ground for RF applications, and may be at the same potential as the support 102 and source side (terminal) of the one or more semiconductor devices 400, the source side (terminal) of the one or more semiconductor devices 400 can be attached to the inner die attach region of the support 102 before the electrically insulative member 502 may be attached to the outer peripheral region 116 of the support 102. Alternatively, the electrically insulative member 502 may be attached to the outer peripheral region 116 of the support 102 before the one or more semiconductor devices 400 may be attached to the inner die attach region of the support 102.

In either case, the electrically insulative member 502 of the window frame 500 has an opening 506 for receiving the one or more semiconductor devices 400, the at least one device 200, and the at least one secondary device 300, and/or any other components attached to the support 102. The electrically insulative member 502 extends outward beyond the lateral sidewall 114 of the support 102 to provide support for the upper and lower metallizations provided at the opposing sides of the electrically insulative member 502.

The support 102 may dissipate the heat generated by the one or more semiconductor devices 400, the at least one device 200, and the at least one secondary device 300, while simultaneously isolating and protecting the one or more semiconductor devices 400, the at least one device 200, and the at least one secondary device 300 from the outside environment.

The support 102 may be implemented as a metal submount and may be implemented as a support, a surface, a package support, a package surface, a package support surface, a flange, a metal flange, a heat sink, a common source support, a common source surface, a common source package support, a common source package surface, a common source package support surface, a common source flange, a common source heat sink, a leadframe, a metal leadframe and/or the like. The support 102 may include an insulating material, a dielectric material, and/or the like.

Additionally, the one or more semiconductor devices 400 may include one or more transistors having one or more transistor dies attached directly or indirectly to the substrate 102 as illustrated in FIG. 2. The one or more transistors having one or more transistor dies may include one or more laterally-diffused metal-oxide semiconductor (LDMOS) transistors, GaN based transistors, Metal Semiconductor Field-Effect transistors (MESFET), Metal Oxide Field Effect Transistors (MOSFET), Junction Field Effect Transistors (JFET), Bipolar Junction Transistors (BJT), Insulated Gate Bipolar Transistors (IGBT), high-electron-mobility transistors (HEMI), Wide Band Gap (WBG) transistors, and/or the like.

Other implementations of the package 100 may include an over-mold configuration. The over-mold configuration may substantially surround the one or more semiconductor devices 400, which are mounted on the support 102. The over-mold configuration may be formed of a plastic or a plastic polymer compound, which may be injection molded around the support 102, the one or more semiconductor devices 400, the at least one device 200, and the at least one secondary device 300, thereby providing protection from the outside environment.

In one aspect, the over-mold configuration may substantially surround the one or more semiconductor devices 400, the at least one device 200, and the at least one secondary device 300. The over-mold configuration may be formed of a plastic, a mold compound, a plastic compound, a polymer, a polymer compound, a plastic polymer compound, and/or the like. The over-mold configuration may be injection or compression molded around the one or more semiconductor devices 400, the at least one device 200, and the at least one secondary device 300, thereby providing protection for the at least one device 200, the at least one secondary device 300, the one or more semiconductor devices 400, and other components of the package 100 from the outside environment.

Although the Figures illustrate a single one of the at least one device 200, the package 100 may implement a plurality of the at least one device 200. Similarly, although the Figures illustrate a single one of the at least one secondary device 300, the package 100 may implement a plurality of the at least one secondary device 300.

FIG. 2 and FIG. 3 further illustrate that the at least one device 200 may connect to the at least one secondary device 300 by the one or more interconnects 104. More specifically, the at least one device 200 may include an interconnect pad; and the at least one secondary device 300 may include an interconnect pad. The one or more interconnects 104 may connect to the interconnect pads.

The one or more bond wires 112 may be implemented as one or more wires, leads, circuit traces, tracks, clips, and/or the like. In one aspect, the one or more bond wires 112 may utilize the same type of connection. In one aspect, the one or more bond wires 112 may utilize different types of connections. Other types of connections for the at least one device 200, the at least one secondary device 300, and/or the one or more semiconductor devices 400 are contemplated as well. The one or more bond wires 112 may utilize ball bonding, wedge bonding, compliant bonding, ribbon bonding, metal clip attach, and/or the like. The one or more bond wires 112 may be include various metal materials including one or more of aluminum, copper, silver, gold, and/or the like. In one aspect, the bond wires 112 may utilize the same type of metal. In one aspect, the one or more bond wires 112 may utilize different types of metal.

The one or more bond wires 112 may connect to the interconnect pad by an adhesive, soldering, sintering, eutectic bonding, thermal compression bonding, ultrasonic bonding/welding, a clip component, and/or the like as described herein. In one aspect, the connections may utilize the same type of connection. In one aspect, the connections may utilize different types of connections.

The one or more interconnects 104 may be implemented as one or more wires, leads, circuit traces, tracks, clips, and/or the like. In one aspect, the one or more interconnects 104 may utilize the same type of connection. In one aspect, the one or more interconnects 104 may utilize different types of connections. Other types of connections for the at least one device 200 and/or the at least one secondary device 300 are contemplated as well. The one or more interconnects 104 may utilize ball bonding, wedge bonding, compliant bonding, ribbon bonding, metal clip attach, and/or the like. The one or more interconnects 104 may be include various metal materials including one or more of aluminum, copper, silver, gold, and/or the like. In one aspect, the one or more interconnects 104 may utilize the same type of metal. In one aspect, the one or more interconnects 104 may utilize different types of metal.

The one or more interconnects 104 may connect to the interconnect pad by an adhesive, soldering, sintering, eutectic bonding, thermal compression bonding, ultrasonic bonding/welding, a clip component, and/or the like as described herein. In one aspect, the connections may utilize the same type of connection. In one aspect, the connections may utilize different types of connections.

The window frame 500 may be a printed circuit board (PCB) component, a ceramic component, a glass component, a low temperature co-fired ceramic (LTCC) component, a high temperature co-fired ceramic (HTCC) component, and/or the like. In one or more aspects, the window frame 500 may include Teflon and/or hydrocarbon materials. In one or more aspects, the window frame 500 may include Teflon and/or hydrocarbon materials mixed with ceramic fillers. In one or more aspects, the window frame 500 may include Teflon and/or hydrocarbon materials mixed with ceramic fillers implemented as radio frequency (RF) materials.

The package 100 may be implemented as an RF package and the at least one secondary device 300 may be implemented as a radio frequency device may include, connect, support, or the like a transmitter, transmitter functions, a receiver, receiver functions, a transceiver, transceiver functions, matching network functions, harmonic termination circuitry, integrated passive devices (IPD), and the like. The at least one secondary device 300 implemented as a radio frequency device may be configured to, may support, or the like transmitting a radio wave and modulating that wave to carry data with allowable transmitter power output, harmonics, and/or band edge requirements. The at least one secondary device 300 implemented as a radio frequency device may be configured to, may support, or the like receiving a radio wave and demodulating the radio wave.

The package 100 may be implemented as an RF package and the at least one device 200 may be implemented as a radio frequency device may include, connect, support, or the like a transmitter, transmitter functions, a receiver, receiver functions, a transceiver, transceiver functions, matching network functions, harmonic termination circuitry, integrated passive devices (IPD), and the like. The at least one device 200 implemented as a radio frequency device may be configured to, may support, or the like transmitting a radio wave and modulating that wave to carry data with allowable transmitter power output, harmonics, and/or band edge requirements. The at least one device 200 implemented as a radio frequency device may be configured to, may support, or the like receiving a radio wave and demodulating the radio wave.

The at least one device 200 may be mounted on an upper surface of the support 102 by an adhesive, soldering, sintering, eutectic bonding, ultrasonically welding, and/or the like as described herein. In one aspect, the at least one device 200 may be directly mounted on the upper surface of the support 102.

In one aspect, the at least one device 200 may be mounted on the upper surface of the support 102 with intervening structures, components, and/or the like. The at least one device 200 may be arranged vertically above the support 102 along the y-axis as illustrated in FIG. 2. The at least one device 200 may be attached to the support 102 as described herein by an adhesive, soldering, sintering, eutectic bonding, ultrasonically welding, and/or the like.

The at least one secondary device 300 may be mounted on the upper surface of the support 102. The at least one secondary device 300 may be mounted on the upper surface of the support 102 by an adhesive, soldering, sintering, eutectic bonding, ultrasonically welding, and/or the like. In one aspect, the at least one secondary device 300 may be directly mounted on the upper surface of the support 102.

In one aspect, the at least one secondary device 300 may be mounted on the upper surface of the support 102 with intervening structures, components, and/or the like. The at least one secondary device 300 may be arranged vertically above the support 102 along the y-axis as illustrated in FIG. 2. The at least one secondary device 300 may be attached to the support 102 as described herein by an adhesive, soldering, sintering, eutectic bonding, ultrasonically welding, and/or the like.

Figure 7:
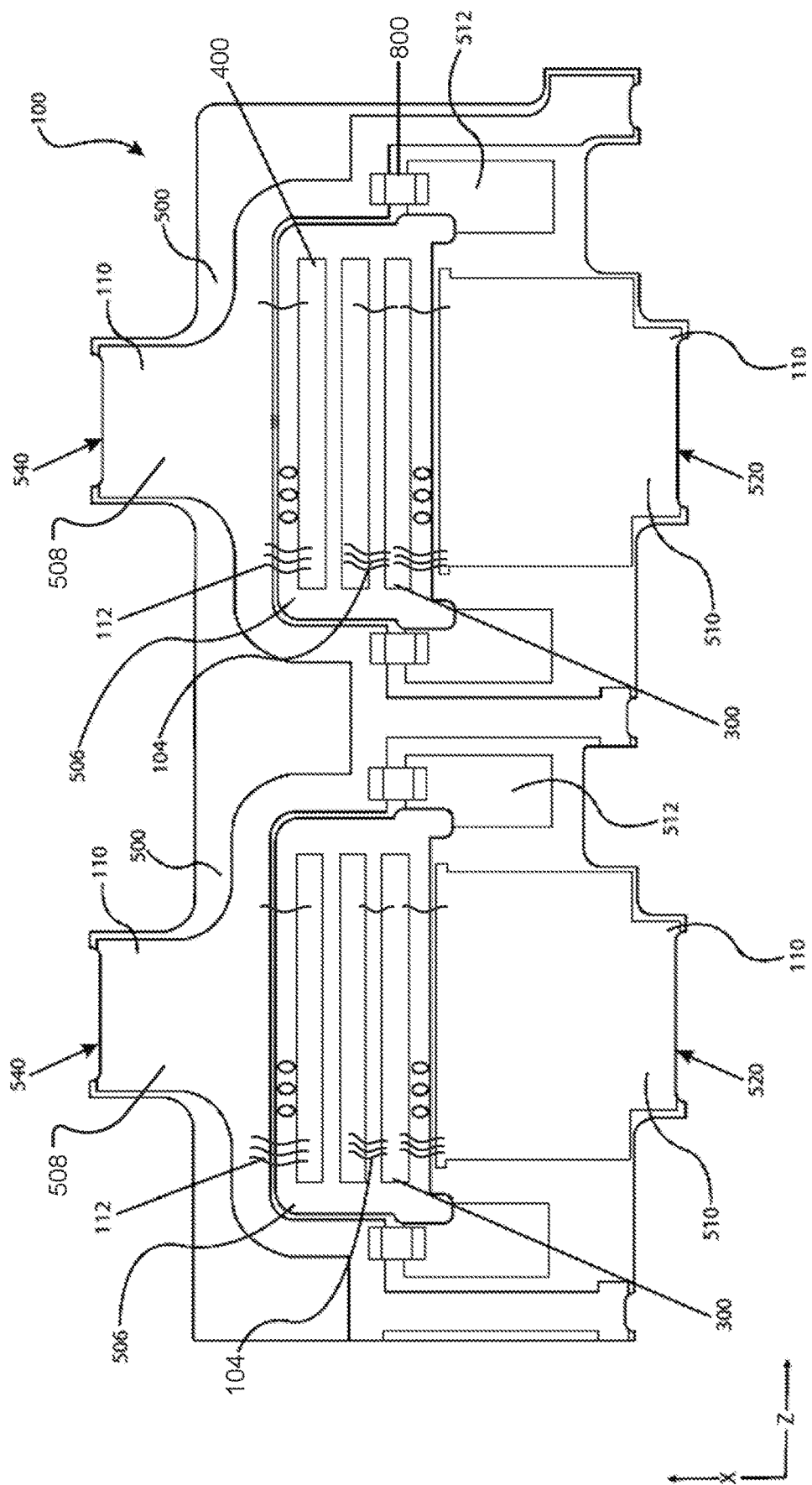
FIG. 7 illustrates an internal top view of a package according to the disclosure.

FIG. 7 illustrates an internal top view of a package according to the disclosure.

In particular, FIG. 7 illustrate an exemplary implementation of a package 100 that may include any one or more of the features, components, arrangements, and the like as described herein. In particular, the package 100 illustrated in FIG. 7 may be implemented as a RF package, a RF amplifier package, a RF power amplifier package, a RF power transistor package, a RF power amplifier transistor package, and/or the like as described herein.

With reference further reference to FIG. 7, the package 100 may be configured with a plurality of the opening 506, a plurality of the one or more metal contacts 110, and the like. Although FIG. 7 illustrates dual components, the package 100 may include any number of components.

The package 100 may be implemented in any number of different applications. In this regard, the package 100 may be implemented in applications implementing high video bandwidth power amplifier transistors, a single path radio frequency power transistor, a single stage radio frequency power transistor, a multipath radio frequency power transistor, a Doherty configuration a multistage radio frequency power transistor, a GaN based radio frequency power amplifier module, a laterally-diffused metal-oxide semiconductor (LDMOS) device, a LDMOS radio frequency power amplifier module, a radio frequency power device, an ultra-wideband device, a GaN based device, a Metal Semiconductor Field-Effect Transistor (MESFET), a Metal Oxide Field Effect Transistor (MOSFET), a Junction Field Effect Transistor (JFET), a Bipolar Junction Transistor (BJT), an Insulated Gate Bipolar Transistor (IGBT), a high-electron-mobility transistor (HEMT), a Wide Band Gap (WBG) semiconductor, a power module, a gate driver, a component such as a General-Purpose Broadband component, a Telecom component, a L-Band component, a S-Band component, a X-Band component, a C-Band component, a Ku-Band component, a Satellite Communications component, and/or the like. The package 100 may be implemented as a power package. The package 100 may be implemented as a power package and may implement applications and components as described herein.

The package 100 may be implemented as a radio frequency package. The package 100 may be implemented as a radio frequency package and may implement applications and components as described herein. The package 100 implemented as a radio frequency package may include, connect, support, or the like a transmitter, transmitter functions, a receiver, receiver functions, a transceiver, transceiver functions, and the like. The package 100 implemented as a radio frequency package may be configured to, may support, or the like transmitting a radio wave and modulating that wave to carry data with allowable transmitter power output, harmonics, and/or band edge requirements. The package 100 implemented as a radio frequency package may be configured to, may support, or the like receiving a radio wave and demodulating the radio wave. The package 100 implemented as a radio frequency package may be configured to, may support, or the like transmitting a radio wave and modulating that wave to carry data with allowable transmitter power output, harmonics, and/or band edge requirements; and may be configured to, may support, or the like receiving a radio wave and demodulating the radio wave.

The at least one secondary device 300 may be an active device, a passive device, an integrated passive device (IPD), a transistor device, or the like. The at least one secondary device 300 may include any electrical component for any application. The at least one secondary device 300 implemented as a radio frequency device, a radio frequency circuit, a radio frequency component, or the like may include, connect, support, or the like a transmitter, transmitter functions, a receiver, receiver functions, a transceiver, transceiver functions, and the like. The at least one secondary device 300 implemented as a radio frequency device may be configured to, may support, or the like transmitting a radio wave and modulating that wave to carry data with allowable transmitter power output, harmonics, and/or band edge requirements. The at least one secondary device 300 implemented as a radio frequency device may be configured to, may support, or the like receiving a radio wave and demodulating the radio wave. The at least one secondary device 300 implemented as a radio frequency device may be configured to, may support, or the like transmitting a radio wave and modulating that wave to carry data with allowable transmitter power output, harmonics, and/or band edge requirements; and may be configured to, may support, or the like receiving a radio wave and demodulating the radio wave.

The metallization layers may be manufactured utilizing one or more manufacturing techniques including print screening or dispensing for solder paste, print screening or dispensing for epoxy, silk screen printing processes, photo-engraving processes, print onto transparent film processes, photo mask processes, photo-sensitized board processes, laser resist ablation processes, milling processes, laser etching processes, and/or like processes.

Figure 8:
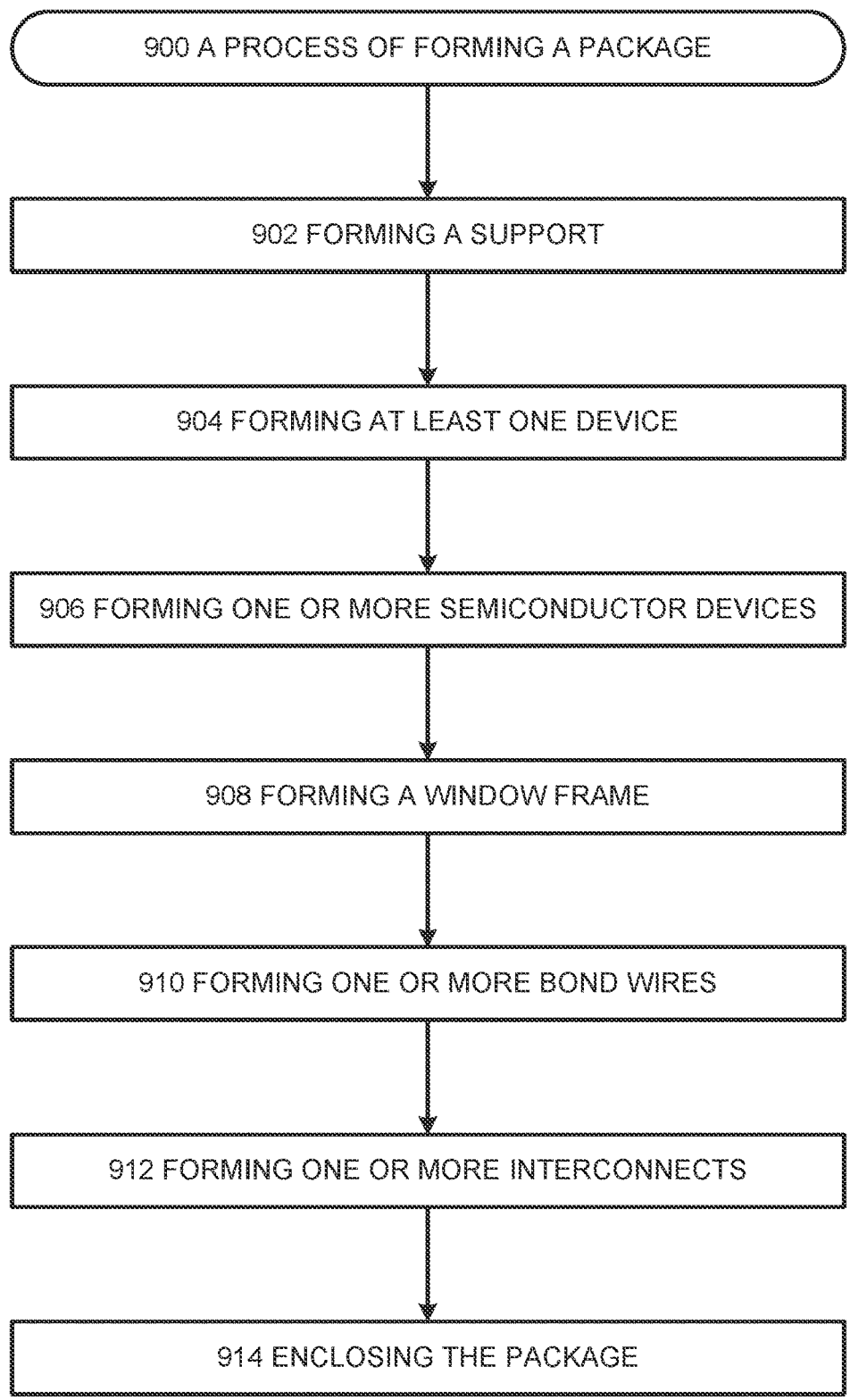
FIG. 8 illustrates a process of making a package according to the disclosure.
Figure 9:
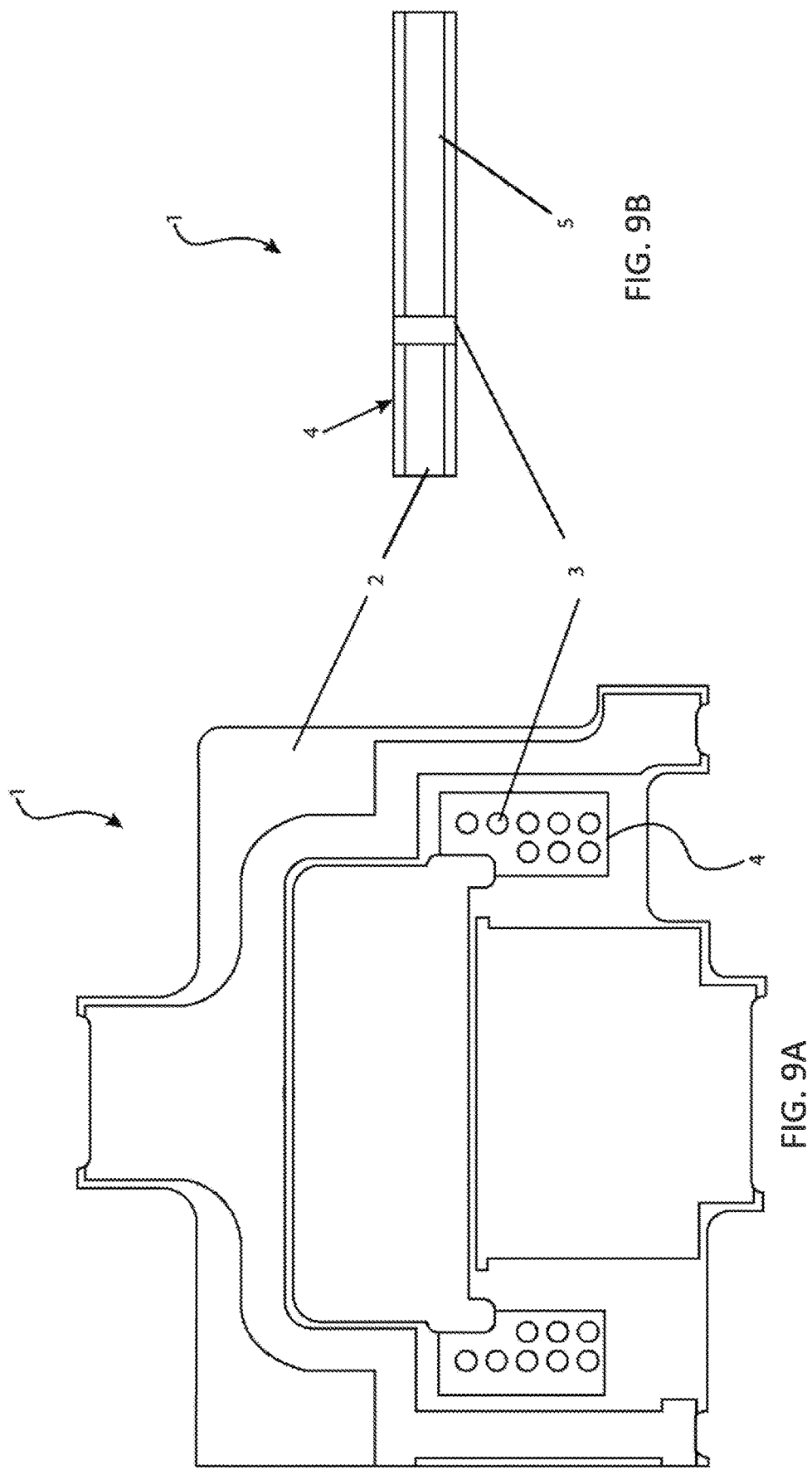
FIG. 9 includes FIG. 9A illustrating a top view of a prior art window frame.

FIG. 8 illustrates a process of making a package according to the disclosure.

In particular, FIG. 8 illustrates a process of forming a package 900 that relates to the package 100 as described herein. It should be noted that the aspects of the process of forming a package 900 may be performed in a different order consistent with the aspects described herein. Moreover, the process of forming a package 900 may be modified to have more or fewer processes consistent with the various aspects disclosed herein.

Initially, the process of forming a package 900 may include a process of forming the support 902. More specifically, the support 102 may be constructed, configured, and/or arranged as described herein. In one aspect, the process of forming the support 902 may include forming the support 102 as a support, a surface, a package support, a package surface, a package support surface, a flange, a heat sink, a common source heat sink, and/or the like.

In this regard, forming the support 902 may include forming the support 102 as a metal submount and may be implemented as a support, a surface, a package support, a package surface, a package support surface, a flange, a metal flange, a heat sink, a common source support, a common source surface, a common source package support, a common source package surface, a common source package support surface, a common source flange, a common source heat sink, a leadframe, a metal leadframe and/or the like. The support 102 may include an insulating material, a dielectric material, and/or the like.

The process of forming a package 900 may include a process of forming at least one device 904. More specifically, the at least one device 200 may be constructed, configured, and/or arranged as described herein. Additionally, the process of forming a package 900 may include a process of mounting and connecting the at least one device 200 to the support 102. The process of forming at least one device 904 may include a process of forming at least one secondary device 300. More specifically, the at least one secondary device 300 may be constructed, configured, and/or arranged as described herein. Additionally, the process of forming at least one device 904 may include a process of mounting and connecting the at least one secondary device 300 to the support 102.

The process of forming a package 900 may include a process of forming one or more semiconductor devices 906. More specifically, the one or more semiconductor devices 400 may be constructed, configured, and/or arranged as described herein.

The process of forming a package 900 may include a process of forming a window frame 908. More specifically, the process of forming a window frame 908 may include forming the window frame 500 that may be constructed, configured, and/or arranged as described herein. More specifically, the process of forming the window frame 908 may include utilizing printed circuit board (PCB) manufacturing to form the window frame 500.

The process of forming a window frame 908 may include cutting a panel utilizing cutting equipment such as wafer, PCB, or package sawing equipment to singulate the window frame 500 from the panel.

Further, the process of forming a window frame 908 may include forming the metallization layers. More specifically, the metallization layers may be constructed; configured, and/or arranged as described herein on at least a portion of the window frame 500. In particular, forming a window frame 908 may include forming the second lower metallization 514, the second metallization 508, the lower first metallization 570, the first metallization 512, the third lower metallization 516 and/or the third metallization 510.

Further, the process of forming a window frame 908 may include forming the edge platings. More specifically, the edge platings may be constructed, configured, and/or arranged as described herein on at least a portion of the window frame 500. In particular, the process of forming a window frame 908 may include forming the edge platings may include forming the electrical connection 520 to extend from the edge 522 of the third metallization 510 down to the edge 524 of the third lower metallization 516. Although FIG. 5 illustrates a particular location for the electrical connection 520, the electrical connection 520 may be located anywhere within the window frame 500 to connect the third metallization 510 to the third lower metallization 516. In particular, in some aspects the electrical connection 520 may be located on the outer edges of the window frame 500; and/or in some aspects the electrical connection 520 may be located on the inner edges of the window frame 500 within the opening 506 of the window frame 500.

Additionally, the process of forming a window frame 908 may include forming the edge platings may include forming the electrical connection 530 to extend from the edge 532 of the first metallization 512 down to the edge 534 of the lower first metallization 570. Although FIG. 4 illustrates a particular location for the electrical connection 530, the electrical connection 530 may be located anywhere within the window frame 500 to connect the first metallization 512 to the lower first metallization 570. In particular, in some aspects the electrical connection 530 may be located on the outer edges of the window frame 500; and/or in some aspects the electrical connection 530 may be located on the inner edges of the window frame 500 within the opening 506 of the window frame 500.

Moreover, the process of forming a window frame 908 may include forming the edge platings may include forming the electrical connection 540 may extend from the edge 542 of the second metallization 508 down to the edge 544 of the second lower metallization 514. Although FIG. 6 illustrates a particular location for the electrical connection 540, the electrical connection 540 may be located anywhere within the window frame 500 to connect the second metallization 508 to the second lower metallization 514. In particular, in some aspects the electrical connection 540 may be located on the outer edges of the window frame 500; and/or in some aspects the electrical connection 540 may be located on the inner edges of the window frame 500 within the opening 506 of the window frame 500.

The process of forming a window frame 908 may include utilizing one or more manufacturing techniques including print screening for solder past, print screening for epoxy, silk screen printing processes, photoengraving processes, print onto transparent film processes, photo mask processes in combination with etching processes, photo-sensitized board processes, laser resist ablation processes, routing processes, milling processes, laser etching processes, direct metal printing processes, and/or like processes.

The process of forming a window frame 908 a process of forming a discrete device, More specifically, the discrete device 800 may be constructed, configured, and/or arranged as described herein. Additionally, the process of forming a window frame 908 may include a process of forming a discrete device 800 that may include mounting and connecting the discrete device 800 to the second metallization 508 and the first metallization 512. The process of forming a window frame 908 may include implementing a pick and place assembly, picking tool, or the like to place the window frame 500 on the support 102. Thereafter, the process of forming a window frame 908 may further include attaching the window frame 500 to the support 102. In this regard, the window frame 500 may be mounted on the upper surface of the support 102 by an adhesive and/or the like as described herein.

The process of forming a package 900 may include a process of forming one or more bond wires 910. More specifically, the one or more bond wires 112 may be constructed, configured, and/or arranged as described herein.

The process of forming one or more bond wires 910 may include coupling the one or more bond wires 112 to the one or more semiconductor devices 400, the window frame 500, the one or more metal contacts 110, the at least one device 200, and/or the at least one secondary device 300.

In one aspect, the process of forming one or more bond wires 910 may include forming the one or more bond wires 112 by forming one or more wires, leads, and/or the like. In one aspect, the process of forming the one or more bond wires 112 may include connecting the one or more bond wires 112 by an adhesive, soldering, sintering, eutectic bonding, ultrasonic welding, a clip component, and/or the like as described herein.

The process of forming a package 900 may include a process of forming one or more interconnects 912. More specifically, the one or more interconnects 104 may be constructed, configured, and/or arranged as described herein.

The process of forming one or more interconnects 912 may include coupling the one or more interconnects 104 to the one or more semiconductor devices 400, the window frame 500, the at least one of the one or more metal contacts 110, the at least one device 200, and/or to the at least one secondary device 300.

In one aspect, the process of forming one or more interconnects 912 may include forming the one or more interconnects 104 by forming one or more wires, leads, and/or the like. In one aspect, the process of forming the one or more interconnects 104 may include connecting the one or more interconnects 104 by an adhesive, soldering, sintering, eutectic bonding, ultrasonic welding, a clip component, and/or the like as described herein.

In one aspect, the process of forming one or more interconnects 912 may include forming the one or more interconnects 104 by forming one or more wires, leads, and/or the like. In one aspect, the process of forming the one or more interconnects 104 may include connecting the one or more interconnects 104 by an adhesive, soldering, sintering, eutectic bonding, ultrasonic welding, a clip component, and/or the like as described herein.

The process of forming a package 900 may include a process of enclosing the package 914. More specifically, the package 100 may be constructed, configured, and/or arranged as described herein. In one aspect, the process of enclosing the package 900 may include forming an open cavity configuration, an over-mold configuration, or the like.

Accordingly, the disclosure has disclosed devices and processes that result in decreased manufacturing costs. Additionally, the disclosure has disclosed devices and processes that can implement various component configurations to reduce package cost, reduce package manufacturing cost, reduce manufacturing complexity, reduce yield loss, and/or the like. Additionally, the disclosure has disclosed devices and processes that address a number of manufacturing issues and/or performance issues. Moreover, the disclosed configuration and method implementing edge plating may lower a parasitic grounding inductance and resistance. Additionally, the disclosed configuration and method implementing edge plating may lower a parasitic grounding inductance and resistance with higher frequency applications, higher power applications, high-frequency applications and/or high-power applications as defined herein. Moreover, the disclosed configuration and method implementing wide edge plating may lower a parasitic grounding inductance and resistance. In particular, the disclosed configuration and method implementing wide edge plating may lower a parasitic grounding inductance and resistance with higher frequency applications, higher power applications, high-frequency applications and/or high-power applications as defined herein.

In particular aspects, the package 100 of the disclosure may be utilized in wireless base stations that connect to a wireless device. In further aspects, the package 100 of the disclosure may be utilized in amplifiers implemented by wireless base stations that connect to a wireless device. In further aspects, the package 100 of the disclosure may be utilized in wireless devices. In further aspects, the package 100 of the disclosure may be utilized in amplifiers implemented in wireless devices.

In this disclosure it is to be understood that reference to a wireless device is intended to encompass electronic devices such as mobile phones, tablet computers, gaming systems, MP3 players, personal computers, PDAs, user equipment (UE), and the like. A "wireless device" is intended to encompass any compatible mobile technology computing device that can connect to a wireless communication network, such as mobile phones, mobile equipment, mobile stations, user equipment, cellular phones, smartphones, handsets, wireless dongles, remote alert devices, Internet of things (IoT) based wireless devices, or other mobile computing devices that may be supported by a wireless network. The wireless device may utilize wireless communication technologies like GSM, CDMA, wireless local loop, Wi-Fi, WiMAX, other wide area network (WAN) technology, 3G technology, 4G technology, 5G technology, LTE technology, and/or the like.

In this disclosure it is to be understood that reference to a wireless base station is intended to cover base transceiver station (BTS), node B devices, Base Station (BS) devices, evolved node B devices, and the like that facilitate wireless communication between wireless devices and a network. The wireless base station and/or the network may utilize wireless communication technologies like GSM, CDMA, wireless local loop, Wi-Fi, WiMAX, other wide area network (WAN) technology, 3G technology, 4G technology, 5G technology, LTE technology, and the like.

As described herein, high-power is defined as a peak power of 10 W-2 kW, a peak power of 100 W-500 W, a peak power of 500 W-1 kW, a peak power of 1 kW-1.5 kW, or a peak power of 1.5 kW 2 kW; and/or where high-power defined as a peak power of greater than 10 W, a peak power greater than 500 W, a peak power greater than 1 kW, a peak power greater than 1.5 kW, or a peak power greater than 2 kW.

As described herein, high-frequency is defined as a frequency of 0.4 GHz-6 GHz, a frequency of 1.4 GHz-1.6 GHz, a frequency of 1.8 GHz-2.7 GHz, a frequency of 1 GHz-2 GHz, a frequency of 2 GHz-3 GHz, a frequency of 3 GHz-4 GHz, a frequency of 4 GHz-5 GHz, or a frequency of 5 GHz-6 GHz; and/or where high-frequency is defined as a frequency greater than 1.4 GHz, a frequency greater than 1.8 GHz, a frequency greater than 2 GHz, a frequency greater than 3 GHz, a frequency greater than 4 GHz, a frequency greater than 5 GHz, or a frequency greater than 6 GHz.

The adhesive of the disclosure may be utilized in an adhesive bonding process that may include applying an intermediate layer to connect surfaces to be connected. The adhesive may be organic or inorganic; and the adhesive may be deposited on one or both surfaces of the surface to be connected. The adhesive may be utilized in an adhesive bonding process that may include applying adhesive material with a particular coating thickness, at a particular bonding temperature, for a particular processing time while in an environment that may include applying a particular tool pressure. In one aspect, the adhesive may be a conductive adhesive, an epoxy-based adhesive, a conductive epoxy-based adhesive, and/or the like.

The solder of the disclosure may be utilized to form a solder interface that may include solder and/or be formed from solder. The solder may be any fusible metal alloy that may be used to form a bond between surfaces to be connected. The solder may be a lead-free solder, a lead solder, a eutectic solder, or the like. The lead-free solder may contain tin, copper, silver, bismuth, indium, zinc, antimony, traces of other metals, and/or the like. The lead solder may contain lead, other metals such as tin, silver, and/or the like. The solder may further include flux as needed.

The sintering of the disclosure may utilize a process of compacting and forming a solid mass of material by heat and/or pressure. The sintering process may operate without melting the material to the point of liquefaction. The sintering process may include sintering of metallic powders. The sintering process may include sintering in a vacuum. The sintering process may include sintering with the use of a protective gas.

The eutectic bonding of the disclosure may utilize a bonding process with an intermediate metal layer that may form a eutectic system. The eutectic system may be used between surfaces to be connected. The eutectic bonding may utilize eutectic metals that may be alloys that transform from solid to liquid state, or from liquid to solid state, at a specific composition and temperature without passing a two-phase equilibrium. The eutectic alloys may be deposited by sputtering, dual source evaporation, electroplating, and/or the like.

The ultrasonically welding of the disclosure may utilize a process whereby high-frequency ultrasonic acoustic vibrations are locally applied to components being held together under pressure. The ultrasonically welding may create a solid-state weld between surfaces to be connected. In one aspect, the ultrasonically welding may include applying a sonicated force.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure.

What is claimed is:

1. A radio frequency (RF) package, comprising:
a support having a semiconductor die attach region;
at least one semiconductor die;
a frame comprising an electrically insulative member having a lower side attached to the support and an upper side opposite the support;
the frame comprising an opening at least partially registered with said semiconductor die attach region;
the frame comprising an upper metallization having a first metallization and a second metallization at the upper side of the electrically insulative member and a lower metallization at the lower side of the electrically insulative member;
at least one discrete device arranged on the upper metallization, the at least one discrete device being configured as a radio frequency component, and the at least one discrete device having terminals connected to the first metallization and the second metallization; and
the frame comprising an electrically conductive edge connection within the opening of the frame connecting the upper metallization to the lower metallization.

2. The RF package of claim 1
wherein the second metallization forms a terminal of the RF package;
wherein the first metallization and the lower metallization are electrically connected by the electrically conductive edge connection at a region of the electrically insulative member within the opening of the frame; and
wherein the electrically conductive edge connection is structured and arranged to extend from the first metallization to the lower metallization.

3. The RF package of claim 1
wherein the electrically conductive edge connection comprises edge plating;
wherein the electrically conductive edge connection is structured and arranged to extend from the first metallization to the lower metallization; and
wherein the electrically conductive edge connection is arranged on inner edges of the frame within the opening of the frame.

4. The RF package of claim 1 further comprising:
a third metallization disposed on the electrically insulative member; and
a lid on the frame enclosing the opening,
wherein the third metallization forms a terminal of the RF package;

wherein the second metallization forms a terminal of the RF package;
wherein the upper metallization extends to an edge of the frame;
wherein the lower metallization extends an edge of the frame; and
wherein the edge of the frame comprises an electrically conductive edge connection.

5. The RF package of claim 4
wherein the second metallization forms a terminal of the RF package;
wherein the frame protrudes from between the lid and the support; and
wherein the electrically conductive edge connection is structured and arranged to extend from the upper metallization to the lower metallization.

6. The RF package of claim 1, wherein the at least one semiconductor die is a GaN based high-electron-mobility transistor (HEMT).

7. The RF package of claim 1
wherein the second metallization forms a terminal of the RF package;
wherein the at least one discrete device comprises one or more of the following: a resistor, an inductor, and a capacitor;
wherein the electrically conductive edge connection is structured and arranged to extend from the upper metallization to the lower metallization; and
wherein the electrically conductive edge connection is arranged within a cavity of the frame.

8. The RF package of claim 1 further comprising at least one secondary device is configured to implement one or more of the following: an impedance matching circuit, a matching circuit, an input matching circuit, an output matching circuit, a harmonic filter, a harmonic termination, a coupler, a balun, a power combiner, a power divider, a radio frequency (RF) circuit, a radial stub circuit, a transmission line circuit, a fundamental frequency matching circuit, a baseband termination circuit, a second order harmonic termination circuit, a matching network, and an integrated passive device (IPD).

9. The RF package of claim 1 further comprising at least one multiple stage die implementing multiple paths.

10. The RF package of claim 1 being configured as a Doherty amplifier.

11. The RF package according to claim 1, wherein:
the frame further comprises:
a second lower metallization at the lower side of the electrically insulative member and spaced apart from the lower metallization; and
a second electrically conductive edge plating connecting the second metallization to the second lower metallization,
wherein the second metallization forms a terminal of the RF package; and
wherein the second metallization and the second lower metallization are electrically connected by the second electrically conductive edge plating.

12. A process of implementing a radio frequency (RF) package, comprising:
configuring a support having a semiconductor die attach region;
providing at least one semiconductor die;
configuring a frame comprising an electrically insulative member having a lower side attached to the support and an upper side opposite the support;
configuring the frame to have an opening at least partially registered with said semiconductor die attach region;
configuring the frame with an upper metallization having a first metallization and a second metallization at the upper side of the electrically insulative member and a lower metallization at the lower side of the electrically insulative member;
arranging at least one discrete device on the upper metallization, the at least one discrete device being configured as a radio frequency component, and the at least one discrete device having terminals connected to the first metallization and the second metallization; and
configuring the frame with an electrically conductive edge connection within the opening of the frame connecting the upper metallization to the lower metallization.

13. The process of implementing a RF package of claim 12 further comprising connecting the first metallization and the lower metallization by the electrically conductive edge connection at a region of the electrically insulative member within the opening of the frame,
wherein the second metallization forms a terminal of the RF package; and
wherein the electrically conductive edge connection is structured and arranged to extend from the first metallization to the lower metallization.

14. The process of implementing a RF package of claim 12
wherein the electrically conductive edge connection comprises edge plating;
wherein the electrically conductive edge connection is structured and arranged to extend from the first metallization to the lower metallization; and
wherein the electrically conductive edge connection is arranged on inner edges of the frame within the opening of the frame.

15. The process of implementing a RF package of claim 12 further comprising:
configuring the frame to have a third metallization disposed on the electrically insulative member; and
arranging a lid on the frame enclosing the opening,
wherein the third metallization forms a terminal of the RF package;
wherein the second metallization forms a terminal of the RF package;
wherein the upper metallization extends to an edge of the frame; and
wherein the lower metallization extends to the edge of the frame; and
wherein the edge of the frame comprises an electrically conductive edge connection.

16. The process of implementing a RF package of claim 15
wherein the second metallization forms a terminal of the RF package;
wherein the frame protrudes from between the lid and the support; and
wherein the electrically conductive edge connection is structured and arranged to extend from the upper metallization to the lower metallization.

17. The process of implementing a RF package of claim 12, wherein the at least one semiconductor die is a GaN based high-electron-mobility transistor (HEMT).

18. The process of implementing a RF package of claim 12 further comprising configuring the at least one discrete device to include one or more of the following: a resistor, an inductor, and a capacitor, wherein the second metallization forms a terminal of the RF package;

wherein the electrically conductive edge connection is structured and arranged to extend from the upper metallization to the lower metallization; and wherein the electrically conductive edge connection is arranged within a cavity of the frame.

19. The process of implementing a RF package of claim 12 further comprising implementing at least one secondary device as one or more of the following: an impedance matching circuit, a matching circuit, an input matching circuit, an output matching circuit, a harmonic filter, a harmonic termination, a coupler, a balun, a power combiner, a power divider, a radio frequency (RF) circuit, a radial stub circuit, a transmission line circuit, a fundamental frequency matching circuit, a baseband termination circuit, a second order harmonic termination circuit, a matching network, and an integrated passive device (IPD).

20. The process of implementing a RF package of claim 12 further comprising providing a multiple stage die implementing multiple paths.

21. The process of implementing a RF package of claim 12 further comprising configuring the RF package as a Doherty amplifier.

22. The process of implementing a RF package according to claim 12, further comprising:
configuring a second lower metallization at the lower side of the electrically insulative member and spaced apart from the lower metallization; and
configuring a second electrically conductive edge plating connecting the second metallization to the second lower metallization,
wherein the second metallization forms a terminal of the RF package; and
wherein the second metallization and the second lower metallization are electrically connected by the second electrically conductive edge plating.

* * * * *